United States Patent
Kuo et al.

(10) Patent No.: US 12,424,538 B2
(45) Date of Patent: Sep. 23, 2025

(54) SEMICONDUCTOR DEVICE INCLUDING DUMMY DEEP TRENCH CAPACITORS AND A METHOD OF MANUFACTURING THEREOF

(71) Applicant: Taiwan Semiconductor Manufacturing Company Ltd., Hsinchu (TW)

(72) Inventors: Fu-Chiang Kuo, Hsinchu (TW); Yu-Hsin Fang, Hsinchu (TW); Min-Hsiung Chen, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 527 days.

(21) Appl. No.: 17/878,197

(22) Filed: Aug. 1, 2022

(65) Prior Publication Data

US 2024/0038654 A1    Feb. 1, 2024

(51) Int. Cl.
*H01L 23/522* (2006.01)
*H01L 23/528* (2006.01)
*H10D 1/00* (2025.01)
*H10D 1/68* (2025.01)
*H01L 23/532* (2006.01)

(52) U.S. Cl.
CPC ...... *H01L 23/5223* (2013.01); *H01L 23/5226* (2013.01); *H01L 23/5283* (2013.01); *H10D 1/042* (2025.01); *H10D 1/716* (2025.01); *H01L 23/53295* (2013.01)

(58) Field of Classification Search
CPC ............ H01L 23/5223; H01L 23/5226; H01L 23/5283; H01L 23/53295; H10D 1/716; H10D 1/042

USPC ......................................................... 257/347
See application file for complete search history.

(56) References Cited

U.S. PATENT DOCUMENTS

| | | | |
|---|---|---|---|
| 10,797,183 B2 * | 10/2020 | Takeuchi | ............ H01L 27/0805 |
| 2009/0104747 A1 | 4/2009 | Lin | |
| 2019/0088800 A1 | 3/2019 | Takeuchi et al. | |

FOREIGN PATENT DOCUMENTS

| TW | 473996 B | 1/2002 |
|---|---|---|
| TW | I763365 B | 5/2022 |

OTHER PUBLICATIONS

Office Action issued in connection with Taiwan Appl. No. 112124276 dated Apr. 15, 2024.

* cited by examiner

*Primary Examiner* — Tu-Tu V Ho
(74) *Attorney, Agent, or Firm* — FOLEY & LARDNER LLP

(57) ABSTRACT

A semiconductor device and a method of manufacturing the semiconductor device are disclosed. In one aspect, at least one active deep trench capacitor (DTC), the at least one active DTC including a plurality of conductive layers and an insulating layer disposed between adjacent conductive layers of the plurality of conductive layers. The semiconductor device includes a plurality of dummy DTCs disposed on opposing sides of the at least one active DTC, the plurality of dummy DTCs and the at least one active DTC arranged in a row. The semiconductor device includes a plurality of conductive structures connected to the plurality of conductive layers of the active DTC, the plurality of dummy DTCs insulated from the at least one active DTC.

20 Claims, 8 Drawing Sheets

SEMICONDUCTOR DEVICE INCLUDING DUMMY DEEP TRENCH CAPACITORS AND A METHOD OF MANUFACTURING THEREOF

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, various package technologies (e.g., a chip on wafer on substrate (CoWoS)) are used to integrate several chips into a single semiconductor device by through silicon via (TSV). In the CoWoS package, a number of chips or dies are assembled on a single semiconductor device. Furthermore, numerous manufacturing operations are implemented within such a small semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
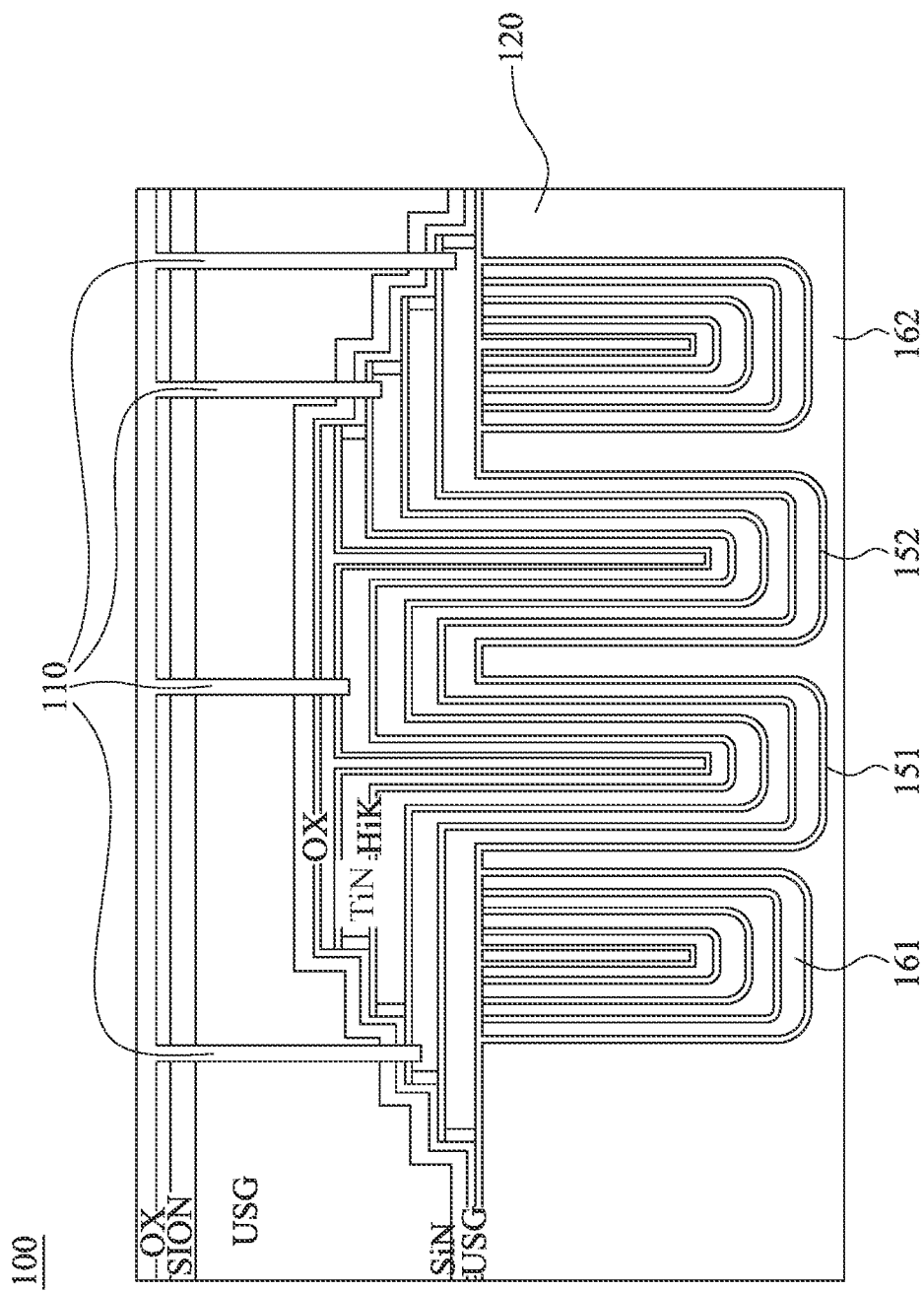
FIG. 1 illustrates a side view of a package that includes a plurality of deep trench capacitors (DTCs), in accordance with some embodiments.
Figure 3:
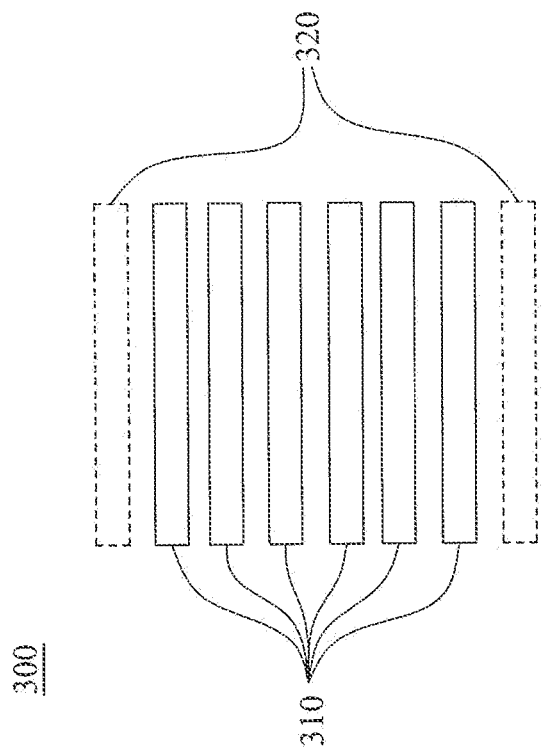
FIGS. 2 and 3 each illustrates a top-down view of an example set of DTCs having a certain orientation, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As several chips are integrated together using the CoWoS process, interposers are formed below the chips and can include routing of signals and power supply lines for the chips that are connected to one another. The TSVs are formed within the interposers to enable the formation of connection lines between chips as well as power supply lines (VDD, VCC, VSS, etc.). The TSVs are then exposed on the opposite side of the interposer and bonded to the package substrate. Within the interposer, DTCs may be formed as decoupling capacitors which can help remove noise and provide stable signals. In order to increase yield of the semiconductor devices, a plurality of DTCs are often designed in a row, the row of DTCs are arranged in both horizontal and vertical orientations. A problem with DTCs is that the outermost DTCs of a set of DTCs may experience bending and/or warping due to a phenomenon called loading effect or etch loading effect. The etch loading effect is a phenomenon that occurs when deep etching of the silicon wafer. The etch loading effect is caused by a difference in the consumption rate of fluorine radicals as the etchants. The etch loading effect can cause warping and/or bending of the DTCs along a row of DTCs, especially along the beginning and the end of the row of DTCs. A critical dimension (CD) of the DTCs, e.g., the space between adjacent DTCs or the width of the DTCs, may be negatively affected, such as the ones along the ends. For example, the space between adjacent DTCs may be reduced, which can cause unintentional cross-coupling or shorting between the DTCs. Also, the width of the DTCs may vary along the ends of the row of DTCs which can affect the capacitance of the DTCs. Accordingly, these variations can cause a reduction in yield. Therefore, there is a desire to improve yield of the chips formed with the DTCs.

In the present disclosure, a novel design of DTCs and surrounding structures can provide several advantages over the current technology. A plurality of dummy DTCs can be formed outside of the outermost active DTCs. The dummy DTCs can be formed exactly like the active DTCs except that they are disconnected from the active DTCs and any via contacts. The dummy DTCs then may be warped and/or bend due to the etch loading effect, but they will not affect the yield because the dummy DTCs are not being used anyway. The dummy DTCs can also be formed having different lengths than the active DTCs. The dummy DTCs can also be formed in segments. The DTCs designed with dummy DTCs on the outermost portions of the set of DTCs may be designed to advantageously reduce or eliminate any bending or warping of the active DTCs, thereby increasing the reliability and yield of the chips.

FIG. 1 illustrates a side view of a package 100 that includes a plurality of DTCs, in accordance with some embodiments. The package 100 may be formed using the CoWoS process and includes contact vias 110 and interposer 120. The interposer 120 may be formed over a substrate (not shown). The interposer 120 may include one or more layers of a semiconductor material such as silicon, germanium, gallium, arsenic, Si—Ge, any other suitable semiconductor material or combination thereof. In some embodiments, the interposer 120 may include a silicon interposer. The substrate may include a package substrate on which the interposer 120 is bonded. The package substrate may transmit electrical signals between the chips to the main board (e.g., printed circuit board (PCB)) on which other semiconductor chips and/or packages may be bonded.

The package 100 also includes a plurality of active DTCs 151 and 152, and dummy DTCs 161 and 162. Although a certain number of active DTCs (e.g., 151 and 152) and dummy DTCs (e.g., 161 and 162) are shown in FIG. 1, embodiments are not limited thereto. For example, there may be more or fewer active DTCs and/or dummy DTCs. Furthermore, the active DTCs and dummy DTCs may have different shapes and/or lengths and/or widths.

The package 100 includes a plurality of materials that are disposed on top of one another. For example, the package includes an undoped silicon glass USG disposed over the interposer that functions as an insulator. Over the undoped silicon glass USG, one or more materials are disposed in layers such as silicon nitride SiN, high-k dielectric material HiK, titanium nitride TiN, oxide OX, and silicon oxide nitride SiON. These layers are shown as an example, and other materials may be formed.

The interposer 120 may include one or more layers of a semiconductor material such as silicon, germanium, gallium, arsenic, Si—Ge, any other suitable semiconductor material or combination thereof. Within the interposer 120, the active DTCs 151 and 152 may be formed. The active DTCs 151 and 152 may add capacitance to the integrated circuits to function as decoupling capacitors which can help remove noise and smooth out the signals that are provided from and to the contact vias 110. The active DTCs 151 and 152 may be connected to one or more signal lines via the contact vias 110. The active DTCs 151 and 152 may include a plurality of capacitors that are formed in parallel to one another. For example, each of the DTCs 151 and 152 may include a plurality of conductive layers (e.g., metal, alloy the titanium nitride TiN, etc.) and a plurality of insulating layers (e.g., of high-k dielectric material HiK) disposed between adjacent conductive layers. However, embodiments are not limited thereto, and there may be more or fewer metal layers and insulating layers. The active DTCs 151 and 152 may be formed in a row.

On opposing ends of the active DTCs 151 and 152, the dummy DTCs 161 and 162 may be formed within the interposer 120. For example, referring to FIG. 1, the dummy DTC 161 may be formed left of the leftmost active DTC 151 and the dummy DTC 162 may be formed to the right of the rightmost active DTC 152. Although not shown, there may be one or more additional active DTCs that are formed between the active DTCs 151 and 152. Furthermore, although the dummy DTCs 161 and 162 are shown to be formed of multiple metal layers and multiple insulating layers, embodiments are not limited thereto. For example the dummy DTCs 161 and 162 may be formed of only a metal material, only an insulating material, two metal layers with an insulating layer interposed therebetween, etc.

The dummy DTCs 161 and 162 may be formed below the undoped silicon glass USG. However, embodiments are not limited thereto, and there may be more or fewer layers formed below the undoped silicon glass USG. Although not shown in FIG. 1, the same material used for the interposer 120 may be disposed between the dummy DTCs 161 and 162 and the undoped silicon glass USG such that the dummy DTCs 161 and 162 are completely isolated and insulated from the active DTCs 151 and 152. Furthermore, the width of the dummy DTCs 161 and 162 may be less than the active DTCs 151 and 152.

The dummy DTCs 161 and 162 may experience the warping/bending due to the etch loading effect. However, this may not affect the functionality or the yield of the package 100 because the dummy DTCs 161 and 162 may be disconnected from the active DTCs 151 and 152 as well as the contact vias 110. Accordingly, the dummy DTCs 161 and 162 may not function as decoupling capacitors themselves but are subject to the etch loading effect.

Figure 2:
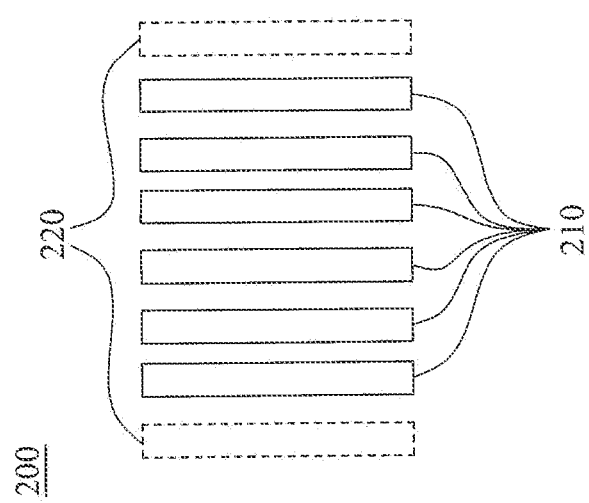

FIG. 2 illustrates a top-down view of an example set (or array) of DTCs 200 having a vertical orientation, in accordance with some embodiments. The set of DTCs 200 may include a plurality of active DTCs 210 and two dummy DTCs 220. The active DTCs 210 may be similar to the active DTCs 151 and 152 of FIG. 1, and the dummy DTCs 220 may be similar to the dummy DTCs 161 and 162 of FIG. 1. The widths of the dummy DTCs 220 may be less than the widths of the active DTCs 210. Although the set of DTCs 200 of FIG. 2 includes six active DTCs 210, embodiments are not limited thereto.

Figure 4:
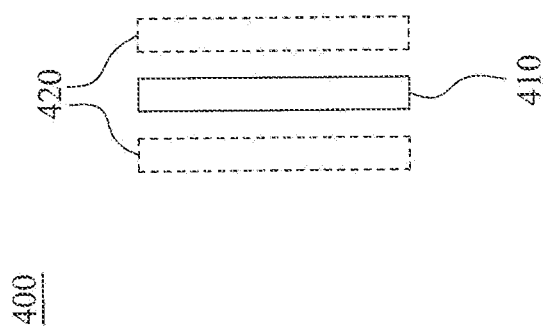

FIG. 4 illustrates a top-down view of an example set of DTCs 400 having a vertical orientation, in accordance with some embodiments. The set of DTCs 400 may include a one active DTC 410 and two dummy DTCs 420. The active DTCs 410 may be similar to the active DTCs 151 and 152 of FIG. 1, and the dummy DTCs 420 may be similar to the dummy DTCs 161 and 162 of FIG. 1. The widths of the dummy DTCs 420 may be less than the width of the active DTC 410. Having one active DTC 410 as shown in FIG. 4 may be the minimum number of active DTCs in the vertical orientation.

Figure 5:
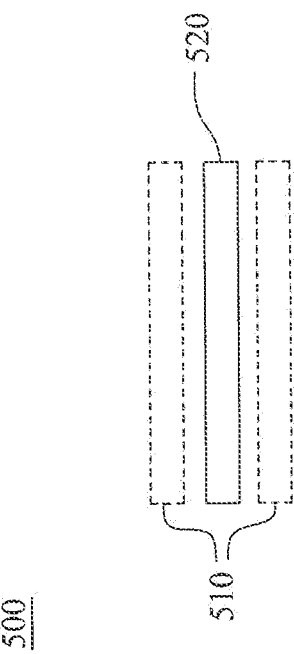
FIGS. 4 and 5 each illustrates a top-down view of an example set of DTCs having one active DTC, in accordance with some embodiments.

FIG. 5 illustrates a top-down view of an example set of DTCs 500 having a horizontal orientation, in accordance with some embodiments. The set of DTCs 500 may include two active DTCs 510 and one dummy DTCs 520. The active DTCs 510 may be similar to the active DTCs 151 and 152 of FIG. 1, and the dummy DTCs 520 may be similar to the dummy DTCs 161 and 162 of FIG. 1. The widths of the dummy DTCs 520 may be less than the width of the active DTC 510. Having one active DTC 510 as shown in FIG. 5 may be the minimum number of active DTCs in the horizontal orientation.

FIG. 5 illustrates a top-down view of an example set of DTCs 500 having a horizontal orientation, in accordance with some embodiments. The set of DTCs 500 may include two active DTCs 510 and two dummy DTCs 520. The active DTCs 510 may be similar to the active DTCs 151 and 152 of FIG. 1, and the dummy DTCs 520 may be similar to the dummy DTCs 161 and 162 of FIG. 1. The widths of the dummy DTCs 520 may be less than the width of the active DTC 510. Having one active DTC 510 as shown in FIG. 5 may be the minimum number of active DTCs in the horizontal orientation.

Figure 6:
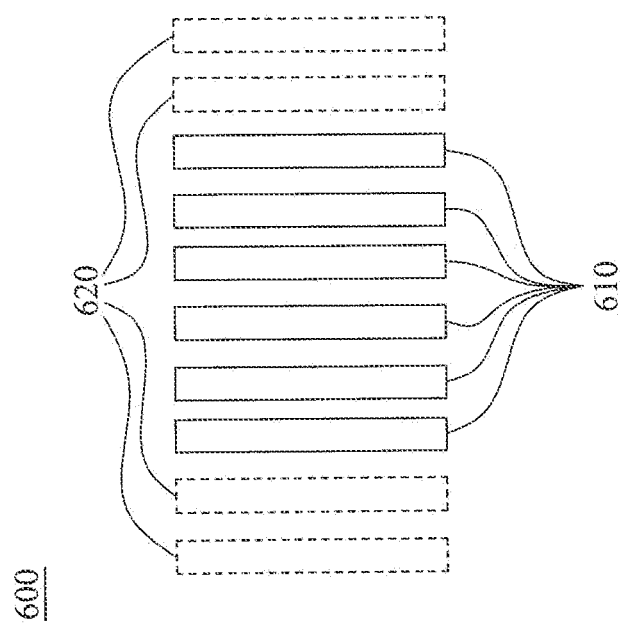

FIG. 6 illustrates a top-down view of an example set of DTCs 600 having a vertical orientation, in accordance with some embodiments. The set of DTCs 600 may include a plurality of active DTCs 610 and four dummy DTCs 620.

The active DTCs 610 may be similar to the active DTCs 151 and 152 of FIG. 1, and the dummy DTCs 620 may be similar to the dummy DTCs 161 and 162 of FIG. 1. The widths of the dummy DTCs 620 may be less than the widths of the active DTCs 610. Two dummy DTCs 620 may be disposed to the left of the leftmost active DTC 610, and two dummy DTCs 620 may be disposed to the right of the rightmost active DTC 610. The additional dummy DTC on both sides of the set of active DTCs 610 may provide some buffer in case bending/warping occurs not just on the outermost DTCs but also the second-most outer DTCs.

Figure 7:
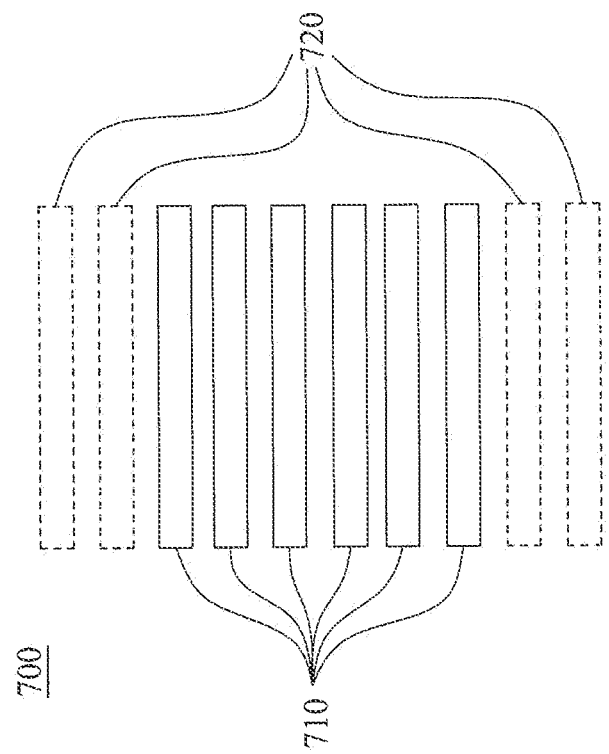
FIGS. 6 and 7 each illustrates a top-down view of an example set of DTCs multiple dummy DTCs on both sides of the active DTCs, in accordance with some embodiments.

FIG. 7 illustrates a top-down view of an example set of DTCs 700 having a horizontal orientation, in accordance with some embodiments. The set of DTCs 700 may include a plurality of active DTCs 710 and four dummy DTCs 720. The active DTCs 710 may be similar to the active DTCs 151 and 152 of FIG. 1, and the dummy DTCs 720 may be similar to the dummy DTCs 161 and 162 of FIG. 1. The widths of the dummy DTCs 720 may be less than the widths of the active DTCs 710. Two dummy DTCs 720 may be disposed above the topmost active DTC 710, and two dummy DTCs 720 may be disposed below the bottommost active DTC 710. The additional dummy DTC on both sides of the set of active DTCs 710 may provide some buffer in case bending/warping occurs not just on the outermost DTCs but also the second-most outer DTCs. Although two dummy DTCs 620 and 720 are shown in FIGS. 6 and 7, respectively, embodiments are not limited thereto, and more dummy DTCs can be disposed on both sides of the sets of active DTCs.

Figure 8:
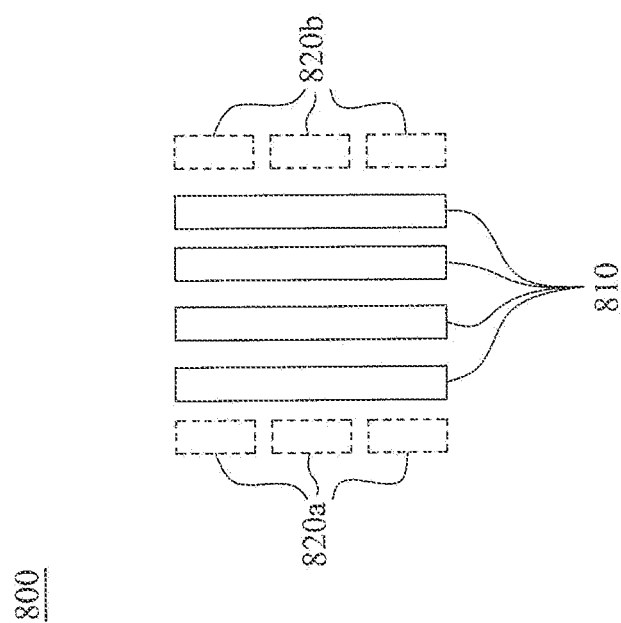

FIG. 8 illustrates a top-down view of an example set of DTCs 800 having a vertical orientation, in accordance with some embodiments. The set of DTCs 800 may include a plurality (collectively, dummy DTCs 820). The active DTCs 810 may be similar to the active DTCs 151 and 152 of FIG. 1, and the dummy DTCs 820 may be similar to the dummy DTCs 161 and 162 of FIG. 1. The first set of dummy DTCs 820a may include three dummy DTCs 820a in series, and the second set of dummy DTCs 820b may include three dummy DTCs 820b in series. Although the dummy DTCs 820a and 820b in FIG. 8 are shown to have substantially similar lengths, embodiments are not limited thereto, and the lengths of each of the dummy DTCs 820a and 820b may be different. Furthermore, the widths of the dummy DTCs 820a and 820b may be less than the widths of the active DTCs 810.

Figure 9:
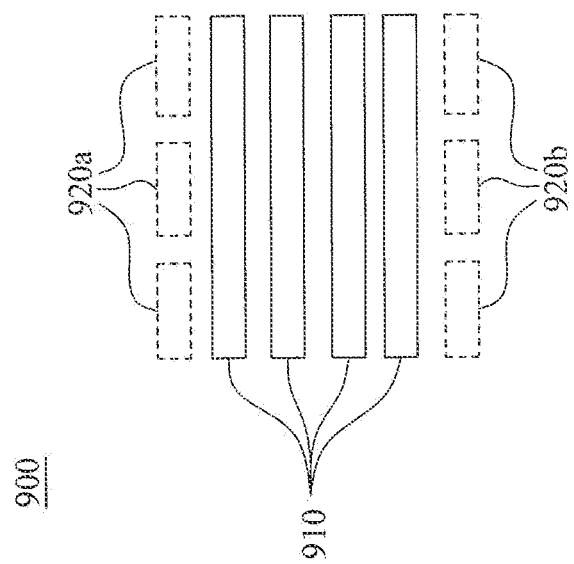
FIGS. 8 and 9 illustrates a top-down view of an example set of DTCs having dummy DTCs with segments, in accordance with some embodiments.

FIG. 9 illustrates a top-down view of an example set of DTCs 900 having a horizontal orientation, in accordance with some embodiments. The set of DTCs 900 may include a plurality of active DTCs 910, a first set of dummy DTCs 920a, and a second set of dummy DTCs 920b (collectively, dummy DTCs 920). The active DTCs 910 may be similar to the active DTCs 151 and 152 of FIG. 1, and the dummy DTCs 920 may be similar to the dummy DTCs 161 and 162 of FIG. 1. The first set of dummy DTCs 920a may include three dummy DTCs 920a in series, and the second set of dummy DTCs 920b may include three dummy DTCs 920b in series. Although the dummy DTCs 920a and 920b in FIG. 9 are shown to have substantially similar lengths, embodiments are not limited thereto, and the lengths of each of the dummy DTCs 920a and 920b may be different. Furthermore, the widths of the dummy DTCs 920a and 920b may be less than the widths of the active DTCs 910.

Figure 10:
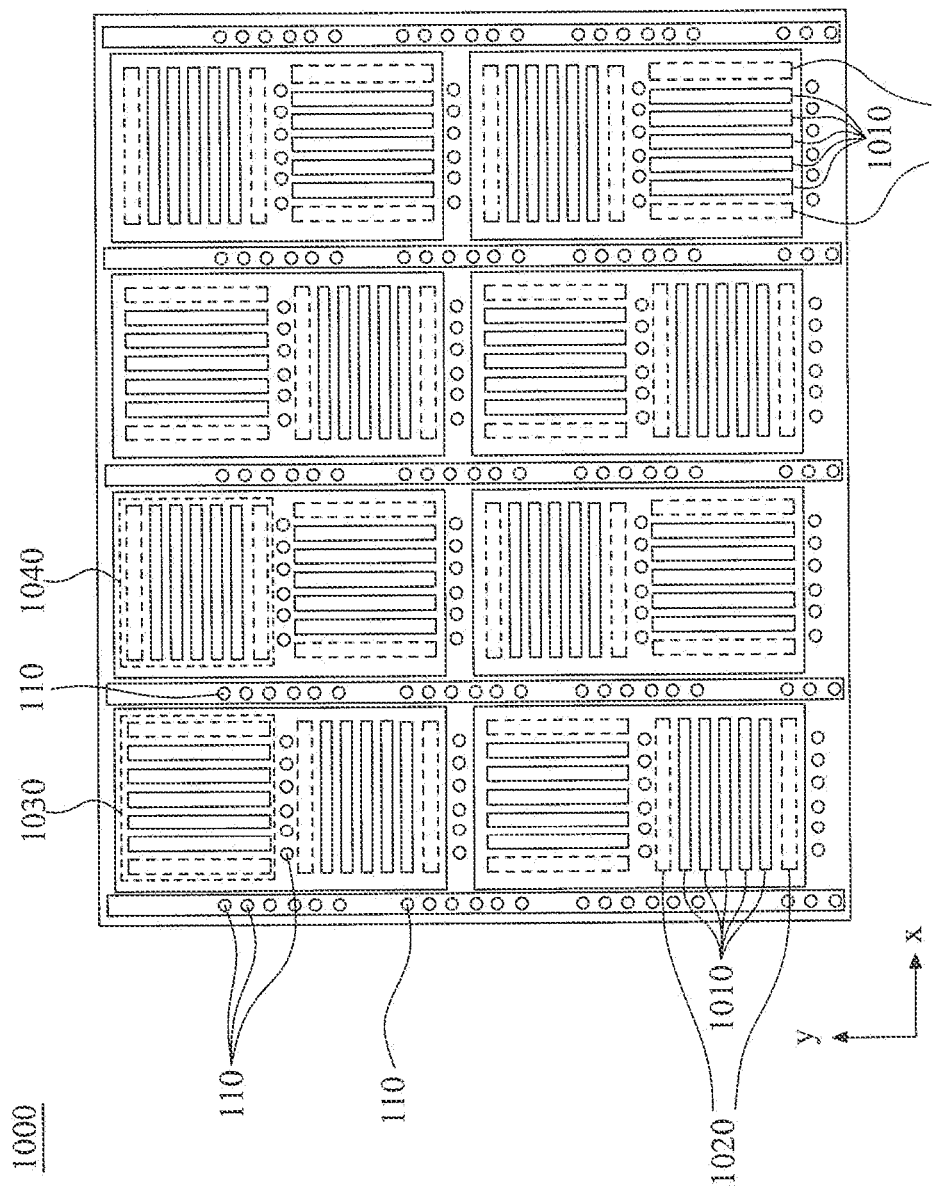
FIG. 10 illustrates a top-down view of an example layout with dummy DTCs, in accordance with some embodiments.

FIG. 10 illustrates a top-down view of an example layout 1000, in accordance with some embodiments. The example layout 1000 includes sets of DTCs 1030 that have a vertical orientation (e.g., sets of DTCs 200, 400, 600, 800) and sets of DTCs 1040 that have a horizontal orientation (e.g., sets of DTCs 300, 500, 700, 900). The example layout 1000 includes a plurality of contact vias 110 (e.g., contact vias 110 of FIG. 1), a plurality of active DTCs 1010 (e.g., active DTCs 151, 152), and a plurality of dummy DTCs 1020 (e.g., dummy DTCs 161, 162).

The set of DTCs 1030 having the vertical orientation may have DTCs that are aligned parallel (or substantially parallel) to one another in the x-direction (e.g., first direction) and extend in the y-direction (e.g., second direction). Each of the sets of DTCs 1030 having the vertical orientation includes five active DTCs 1010 that are aligned parallel to one another, although embodiments are not limited thereto and there may be more or fewer active DTCs 1010 as discussed above. Furthermore, each set of DTCs 1030 having the vertical orientation may have dummy DTCs 1020 that are disposed to the left of the leftmost active DTC 1010 and to the right of the rightmost active DTC 1010. Although not shown in FIG. 10, there may be more dummy DTCs 1020 to the left of the leftmost active DTC 1010 and more dummy DTCs 1020 to the right of the rightmost active DTC 1010 as discussed with respect to FIG. 6. Furthermore, the DTCs 1020 may be separated into series instead of one DTC, as discussed with respect to FIG. 8.

The set of DTCs 1040 having the horizontal orientation may have DTCs that are aligned parallel (or substantially parallel) to one another in the y-direction (e.g., second direction) and extend in the x-direction (e.g., first direction). Each of the sets of DTCs 1040 having the horizontal orientation includes five active DTCs 1010 that are aligned parallel to one another, although embodiments are not limited thereto and there may be more or fewer active DTCs 1010 as discussed above. Furthermore, each set of DTCs 1040 having the horizontal orientation may have dummy DTCs 1020 that are disposed to above of the topmost active DTC 1010 and below the bottommost active DTC 1010. Although not shown in FIG. 10, there may be more dummy DTCs 1020 to the top of the topmost active DTC 1010 and more dummy DTCs 1020 below the bottommost active DTC 1010 as discussed with respect to FIG. 7. Furthermore, the DTCs 1020 may be separated into series instead of one DTC, as discussed with respect to FIG. 8.

Figure 11:
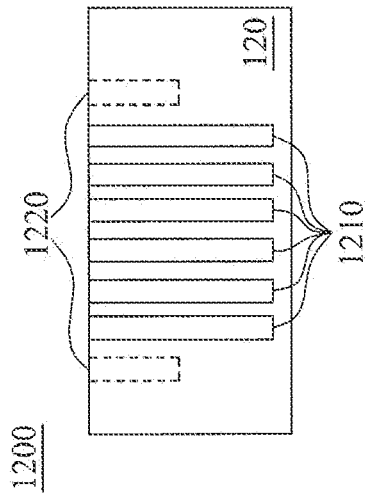
FIGS. 11, 12, and 13 each illustrates a side view of a set of DTCs having certain depths, in accordance with some embodiments.

FIG. 11 illustrates a side view of a set of DTCs 1100 having a horizontal or vertical orientation, in accordance with some embodiments. The DTCs 1100 includes a plurality of active DTCs 1110 (e.g., active DTCs 151, 152) and dummy DTCs 1120 (e.g., dummy DTCs 161, 162). Depending on whether or not the DTCs 1100 have the horizontal orientation or vertical orientation, the DTCs 1100 may be aligned in the x-direction or y-direction, as discussed above. The DTCs 1100 may be formed in the interposer 120. Each of the active DTCs 1110 may extend in a z-direction (third direction) having a certain depth. The dummy DTCs 1120 may extend in the z-direction have a similar depth as or slightly shorter depth than the active DTCs 1110.

Figure 12:
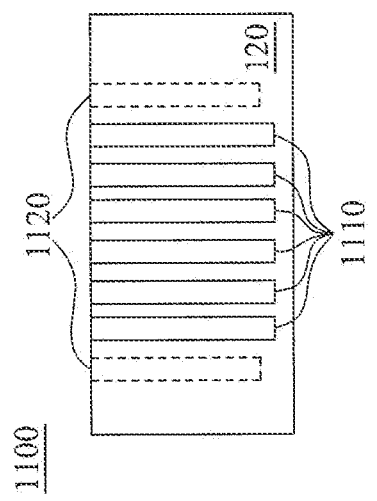

FIG. 12 illustrates a side view of a set of DTCs 1200 having a horizontal or vertical orientation, in accordance with some embodiments. The DTCs 1200 includes a plurality of active DTCs 1210 (e.g., active DTCs 151, 152) and dummy DTCs 1220 (e.g., dummy DTCs 161, 162). Depending on whether or not the DTCs 1200 have the horizontal orientation or vertical orientation, the DTCs 1200 may be aligned in the x-direction or y-direction, as discussed above. The DTCs 1200 may be formed in the interposer 120. Each of the active DTCs 1210 may extend in a z-direction (third direction) having a certain depth. The dummy DTCs 1220 may extend in the z-direction have about half the depth as the active DTCs 1110.

Figure 13:
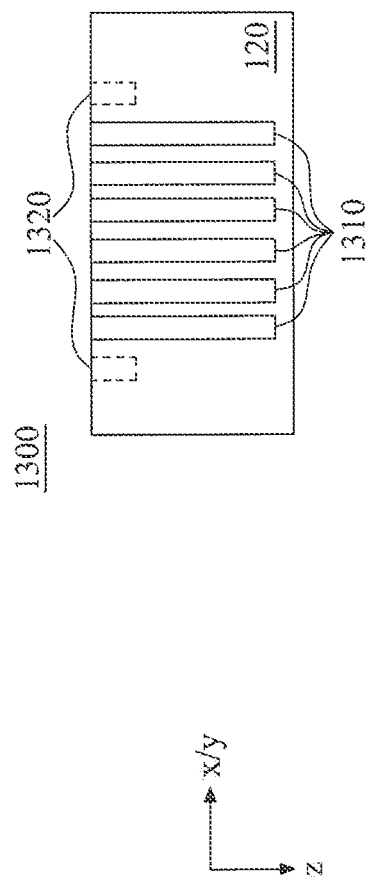

FIG. 13 illustrates a side view of a set of DTCs 1300 having a horizontal or vertical orientation, in accordance with some embodiments. The DTCs 1300 includes a plurality of active DTCs 1310 (e.g., active DTCs 151, 152) and dummy DTCs 1320 (e.g., dummy DTCs 161, 162). Depending on whether or not the DTCs 1300 have the horizontal orientation or vertical orientation, the DTCs 1300 may be aligned in the x-direction or y-direction, as discussed above. The DTCs 1300 may be formed in the interposer 120. Each of the active DTCs 1310 may extend in a z-direction (third direction) having a certain depth. The dummy DTCs 1320 may extend in the z-direction have about a quarter of the depth as the active DTCs 1310. In some embodiments, the dummy DTCs 1320 may extend any depth less than the active DTCs 1310.

Figure 14:
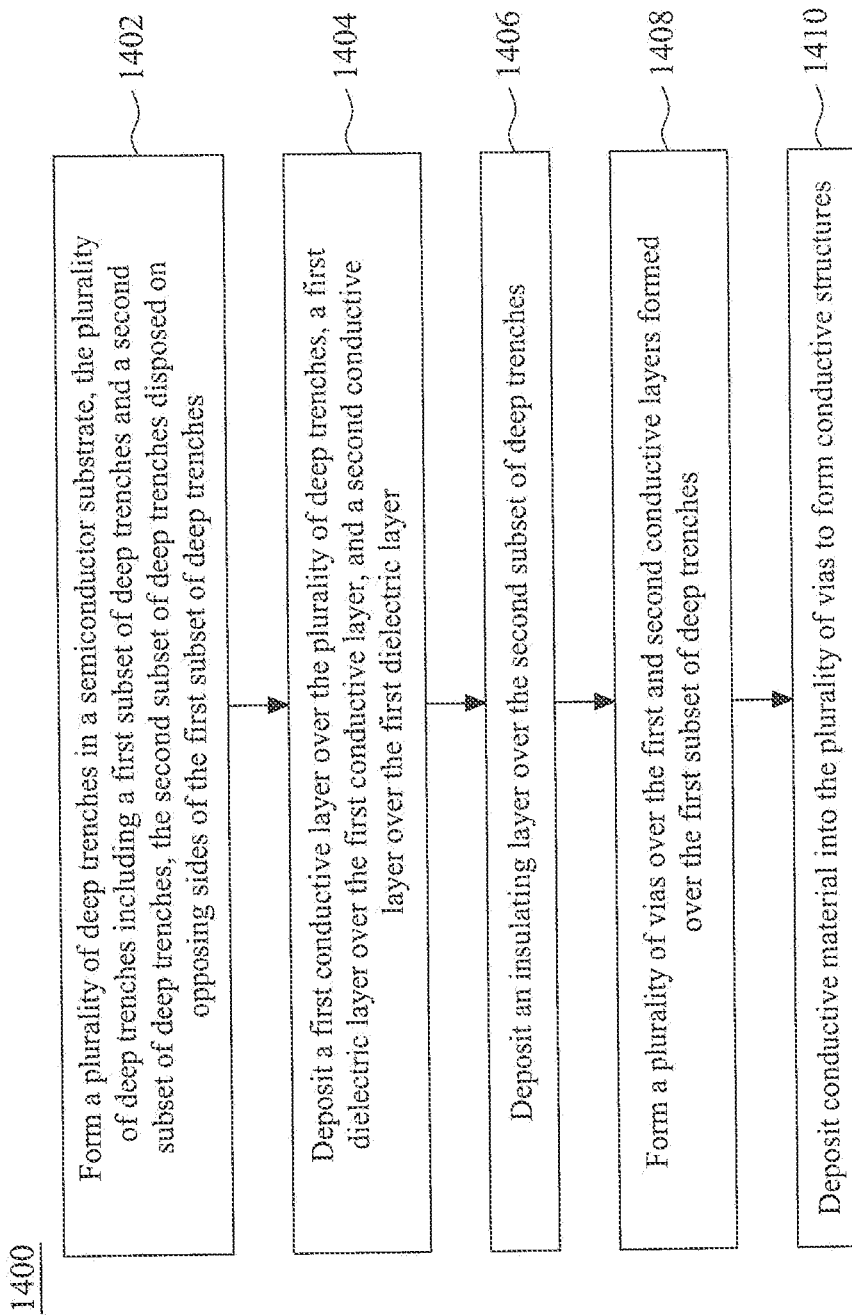
FIG. 14 illustrates a flowchart of an example method of fabricating a semiconductor device, in accordance with some embodiments.

FIG. 14 illustrates a flowchart of an example method 1400 of fabricating a semiconductor device, in accordance with some embodiments. The method 1400 may be used to fabricate a semiconductor package having high AC capacitance density with high yield. For example, at least some of the operations described in the method 1400 use layouts described in FIGS. 2-13. It is noted that the method 1400 is merely an example and is not intended to limit the present disclosure. Accordingly, it is understood that additional operations may be provided before, during, and after the method 1400 of FIG. 14, and that some other operations may only be briefly described herein.

In brief overview, the method 1400 starts with operation 1402 of forming deep trenches in a semiconductor substrate. The plurality of deep trenches may include a first subset of deep trenches and a second subset of deep trenches, the second subset of deep trenches disposed on opposing sides of the first subset of deep trenches. The method 1400 proceeds to operation 1404 of depositing a first conductive layer over the plurality of deep trenches, a first dielectric layer over the first conductive layer, and a second conductive layer over the first dielectric layer. The method 1400 proceeds to operation 1406 of depositing an insulating layer over the second subset of deep trenches. The method 1400 proceeds to operation 1408 of forming a plurality of vias over the first and second conductive layers formed over the first subset of deep trenches. The method 1400 proceeds to operation 1410 of depositing conductive material into the plurality of vias to form conductive structures.

Referring to operation 1402, deep trenches are formed in a semiconductor substrate (e.g., interposer 120). The deep trenches may be formed using lithographic processes such as etching with photomasks. The deep trenches may be formed having alternating horizontal orientation and a vertical orientation as shown in FIG. 10. A first subset of the deep trenches may be designated for active DTCs and a second subset of the deep trenches may be designated for dummy DTCs. The deep trenches may all be formed having the same or substantially similar depths (as shown in FIG. 11). The deep trenches may also be formed to have different depths (as shown in FIGS. 12 and 13). The second subset of deep trenches may be formed with segments as shown in FIGS. 8 and 9. The second subset of deep trenches may include a plurality of deep trenches on one side of the first subset of deep trenches and a plurality of deep trenches on another side of the first subset of deep trenches as shown in FIGS. 6 and 7.

Referring to operation 1404, a first conductive layer is deposited over the plurality of deep trenches, a first dielectric layer is deposited over the first conductive layer, and a second conductive layer is deposited over the first dielectric layer. The layers may be deposited using any known method of depositing materials. In the first subset of deep trenches, active DTCs are formed, and in the second subset of deep trenches, dummy DTCs are formed. There may be more conductive layers and dielectric layers that are deposited over the first and second subsets of deep trenches.

Referring to operation 1406, an insulating layer is deposited or formed over the second subset of deep trenches as well as the conductive and dielectric layers that are deposited over the second subset of deep trenches. The insulating layer may be the undoped silicon glass USG.

Referring to operation 1408, a plurality of vias are formed over the conductive layers that are formed over the first subset of deep trenches including the active DTCs using known methods. The vias are not formed over the second subset of deep trenches (the dummy DTCs) as they are electrically isolated or insulated from the first subset of deep trenches.

Referring to operation 1410, conductive material is deposited in the plurality of vias to form contacts.

In one aspect of the present disclosure, a semiconductor device is disclosed. The semiconductor device includes at least one active DTC including a plurality of conductive layers and an insulating layer disposed between adjacent conductive layers of the plurality of conductive layers. The semiconductor device includes a plurality of dummy DTCs disposed on opposing sides of the at least one active DTC, the plurality of dummy DTCs and the at least one active DTC arranged in a row. The semiconductor device includes a plurality of conductive structures connected to the plurality of conductive layers of the active DTC, the plurality of dummy DTCs insulated from the at least one active DTC.

In another aspect of the present disclosure, a semiconductor device is disclosed. The semiconductor device includes a matrix of sets of DTCs, the sets of DTCs alternating between having a horizontal orientation and a vertical orientation, the sets of DTCs having the horizontal orientation including a plurality of DTCs, and the sets of DTCs having the vertical orientation including a plurality of DTCs. Each set of DTCs includes at least one active DTC including a plurality of conductive layers and an insulating layer disposed between adjacent conductive layers of the plurality of conductive layers and a plurality of dummy DTCs disposed on opposing sides of the at least one active DTC. The plurality of dummy DTCs are insulated from the at least one active DTC, and the plurality of conductive structures connected to the plurality of conductive layers of the at least one active DTC.

In yet another aspect of the present disclosure, a method of manufacturing a semiconductor package is disclosed. The method includes forming a plurality of deep trenches in a semiconductor substrate, the plurality of deep trenches including a first subset of deep trenches and a second subset of deep trenches, the second subset of deep trenches disposed on opposing sides of the first subset of deep trenches. The method further includes depositing a first conductive layer over the plurality of deep trenches, a first dielectric layer over the first conductive layer, and a second conductive layer over the first dielectric layer. The method further includes depositing an insulating layer over the second subset of deep trenches, forming a plurality of vias over the first and second conductive layers formed over the first subset of deep trenches, and depositing conductive material into the plurality of vias to form conductive structures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   at least one active deep trench capacitor (DTC) including a plurality of conductive layers and an insulating layer disposed between adjacent conductive layers of the plurality of conductive layers;
   a plurality of dummy DTCs disposed on opposing sides of the at least one active DTC; and
   a plurality of conductive structures connected to the plurality of conductive layers of the active DTC, the plurality of dummy DTCs insulated from the at least one active DTC.

2. The semiconductor device of claim 1, wherein the plurality of dummy DTCs includes a plurality of first dummy DTCs disposed on one side of the at least one active DTC and a plurality of second dummy DTCs disposed on another side of the at least one active DTC.

3. The semiconductor device of claim 1, wherein each of the plurality of dummy DTCs includes a plurality of dummy DTC segments.

4. The semiconductor device of claim 1, wherein each of the at least one active DTC and the plurality of dummy DTCs have the same depth.

5. The semiconductor device of claim 1, wherein each of the at least one active DTC and the plurality of dummy DTCs have different depths.

6. The semiconductor device of claim 5, wherein the plurality of dummy DTCs have a depth that is about half the depth of the at least one active DTC.

7. The semiconductor device of claim 5, wherein the plurality of dummy DTCs have a depth that is less than half the depth of the at least one active DTC.

8. The semiconductor device of claim 1, wherein the at least one active DTC includes a plurality of active DTCs.

9. A semiconductor device, comprising:
   a matrix of sets of deep trench capacitors (DTCs), the sets of DTCs alternating between having a horizontal orientation and a vertical orientation, the sets of DTCs having the horizontal orientation including a plurality of DTCs, and the sets of DTCs having the vertical orientation including a plurality of DTCs, each set of DTCs including:
      at least one active DTC including a plurality of conductive layers and an insulating layer disposed between adjacent conductive layers of the plurality of conductive layers; and
      a plurality of dummy DTCs disposed on opposing sides of the at least one active DTC, the plurality of dummy DTCs insulated from the at least one active DTC; and
      a plurality of conductive structures connected to the plurality of conductive layers of the at least one active DTC.

10. The semiconductor device of claim 9, wherein the plurality of dummy DTCs includes a plurality of first dummy DTCs disposed on one side of the at least one active DTC and a plurality of second dummy DTCs disposed on another side of the at least one active DTC.

11. The semiconductor device of claim 9, wherein each of the plurality of dummy DTCs includes a plurality of dummy DTC segments that are equidistant to the at least one active DTC.

12. The semiconductor device of claim 9, wherein each of the at least one active DTC and the plurality of dummy DTCs have the same depth.

13. The semiconductor device of claim 9, wherein each of the at least one active DTC and the plurality of dummy DTCs have different depths.

14. The semiconductor device of claim 13, wherein the plurality of dummy DTCs have a depth that is about half the depth of the at least one active DTC.

15. The semiconductor device of claim 13, wherein the plurality of dummy DTCs have a depth that is less than half the depth of the at least one active DTC.

16. A method of manufacturing a semiconductor package, comprising:
   forming a plurality of deep trenches in a semiconductor substrate, the plurality of deep trenches including a first subset of deep trenches for active deep trench capacitors (DTCs) and a second subset of deep trenches for dummy DTCs, the second subset of deep trenches disposed on opposing sides of the first subset of deep trenches, wherein the dummy DTCs are configured to experience warping and bending from etch loading effects in place of the active DTCs;
   progressively increasing depths of the second subset of deep trenches nearest to the first subset of deep trenches to mitigate stress concentration at boundaries between the active and dummy DTCs;
   depositing a first conductive layer over the plurality of deep trenches, a first dielectric layer over the first conductive layer, and a second conductive layer over the first dielectric layer;
   depositing an insulating layer over the second subset of deep trenches;
   forming a plurality of vias over the first and second conductive layers formed over the first subset of deep trenches; and
   depositing conductive material into the plurality of vias to form conductive structures.

17. The method of claim 16, wherein the second subset of deep trenches includes a plurality of first dummy trenches disposed on one side of the first subset of deep trenches and a plurality of second dummy trenches disposed on another side of the first subset of deep trenches.

18. The method of claim 16, wherein each of the second subset of deep trenches includes a plurality of segmented trenches that are arranged equidistant to the first subset of deep trenches.

19. The method of claim 16, wherein the first and second subsets of deep trenches have the same depth.

20. The method of claim 16, wherein the first and second subsets of deep trenches have different depths.

* * * * *